United States Patent
Aboush

(10) Patent No.: US 8,368,224 B2
(45) Date of Patent: Feb. 5, 2013

(54) UNDER LAND ROUTING

(75) Inventor: Zaid Aboush, Cambridge (GB)

(73) Assignee: Cambridge Silicon Radio Ltd., Cambridge (GB)

( * ) Notice: Subject to any disclaimer, the term of this patent is extended or adjusted under 35 U.S.C. 154(b) by 438 days.

(21) Appl. No.: 12/829,745

(22) Filed: Jul. 2, 2010

(65) Prior Publication Data

US 2011/0006434 A1    Jan. 13, 2011

(30) Foreign Application Priority Data

Jul. 7, 2009    (GB) ........................ 0911762
Jul. 22, 2009   (TW) ........................ 98124713 A

(51) Int. Cl.
*H01L 23/52* (2006.01)

(52) U.S. Cl. ....................... 257/773; 257/662

(58) Field of Classification Search ............... 257/773, 257/662
See application file for complete search history.

(56) References Cited

U.S. PATENT DOCUMENTS

| 2006/0022350 | A1 | 2/2006  | Watkins      |
| 2006/0292711 | A1 | 12/2006 | Su et al.    |
| 2007/0052092 | A1 | 3/2007  | Kao          |
| 2007/0063352 | A1 | 3/2007  | Archer et al.|
| 2008/0001296 | A1 | 1/2008  | Tu et al.    |

*Primary Examiner* — Steven Loke
*Assistant Examiner* — Kimberly M Thomas
(74) *Attorney, Agent, or Firm* — Frommer Lawrence & Haug LLP; John W. Branch

(57) ABSTRACT

An electronic component comprising an integrated device and a plurality of packaging layers in which routing between locations on the device and lands on the surface of the component is provided by a redistribution layer. The redistribution layer may be routed below the extent of a contact pad on the surface by providing a channel through the via and redistribution layers underneath that land.

13 Claims, 4 Drawing Sheets

UNDER LAND ROUTING

RELATED APPLICATION

This application claims the benefit of GB 0911767.2 filed on Jul. 7, 2009 and TW 98124713 filed on Jul. 22, 2009 the disclosures of which are incorporated herein by reference in their entirety.

BACKGROUND

This invention relates to packing techniques for integrated devices and in particular to routing under connection lands using the Redistribution Layer (RDL) of a Wafer Level Chip Scale Package (WLCSP).

WLCSP is a packaging technique in which solder bumps or balls for external connections are formed on, and electrically connected to, an integrated device such as an Integrated Circuit (IC), Integrated Passive Device (IPD), Microelectro-Mechanical Systems (MEMS) device, display device, or image sensor device prior to dicing of the wafer or panel.

WLCSP devices comprise an Under Ball Metallisation (UBM) layer on the surface of the device for the formation of solder ball lands, separated from the integrated device by insulating polymer layers. An intermediate metallic RDL is provided for the definition of tracks to connect bond pads on the integrated device to solder ball lands in the UBM layer. Vias through the polymer layers provide connections between the integrated device connection points and the RDL tracks, and between the RDL tracks and the UBM solder ball lands.

FIG. 1 shows plan and cross-section views of a typical WLCSP device. IC layers 102 are formed within the wafer and a lower polymer layer 103 is deposited over the wafer. A via 104 is formed through the first polymer layer 103 to make contact between a bond pad 105 on the IC and the WLCSP RDL 106. An upper polymer layer 107 is deposited over the RDL 106. A via 108 is formed through the upper polymer layer 107 to make contact between the RDL 106 and a land 101 formed in the UBM layer. The UBM land 101 is used for the attachment of solder balls or bumps.

The via 108 between the RDL 106 and UBM land 1019 may be defined to be smaller or bigger than the solder ball land 101 and associated RDL area to provide keying of the layers into the polymer to mechanically anchor the metallic layers to the polymer and thus to the IC.

As the complexity of integrated devices increases the number of external connections required also increases thus leading to increased routing complexity in the RDL and UBM layers.

Routing problems can be addressed by increasing the number of layers (e.g. by using two RDLs), but increasing that is undesirable in this particular application as additional layers also require additional polymer layers. The deposition of polymer layers utilises a thermal process which must be considered against the thermal budget for the integrated device, thereby raising reliability considerations. Additional layers also add process steps and therefore add to the cost of each device.

There is therefore a requirement for a technique to allow improved signal routing between integrated device bond pads and solder ball lands in the UBM layer.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

An electronic component comprising an integrated device and a plurality of packaging layers, the packaging layers comprising a metallic layer of the packaging layers on the surface of the component comprising a land, a metallic redistribution layer of the packaging layers below the surface comprising a first track for routing signals from the land to other locations in the component, an upper insulating layer of the packaging layers between the metallic surface layer and the metallic redistribution layer, a via through the upper insulating layer connecting the land to the track in the redistribution layer, and a second track in the redistribution layer which is routed through a gap in the first track and via below the extent of the land, such that the second track does not make electrical contact with the land, via or first track within the extent of the land.

The via may be formed in at least two discrete parts with an insulating channel between at least two of the parts, wherein the insulating channel forms the gap for routing the second track.

The component may comprise a plurality of lands, vias and tracks, wherein a plurality of tracks are routed through a plurality of corresponding gaps in other tracks and vias.

There is also provided a wafer, or panel, of components comprising at least one component as described above.

There is also provided a method of defining signal routes in an electronic component comprising an integrated device and a plurality of packaging layers, the method comprising the steps of defining a land in a surface metallic layer of the packaging layers, defining a via connecting the land to a first track in a redistribution layer of the packaging layers, wherein the surface metallic layer is separated from the redistribution layer by an upper insulating layer, defining a gap in the via and first track within the extent of the land, and defining a second track in the redistribution layer, wherein the second track is routed through the gap such that it does not make electrical contact with the land, via or first track within the extent of the land.

The via between the land and the first track may be defined in at least two discrete parts with an insulating channel between at least two of the parts forming the gap for the routing of the second track.

The insulating channel may be straight or may be not straight

The electronic component may be a Wafer Level Chip Scale Packaged device, the surface layer may be an Under Ball Metallisation (UBM) layer, the connection point may be a solder ball land, and the integrated device may be an integrated circuit, the component may further comprise a lower insulating layer for insulating the redistribution layer from the integrated circuit, and at least one via through the lower insulating layer connecting a track in the redistribution layer to a pad on the integrated circuit.

There is also provided a method of manufacturing a wafer, or panel, of electronic components comprising a method as described above.

The wafer or panel may comprise at least one component as described above.

The preferred features may be combined as appropriate, as would be apparent to a skilled person, and may be combined with any of the aspects of the invention.

BRIEF DESCRIPTION OF THE DRAWINGS

Embodiments of the invention will be described, by way of example, with reference to the following drawings, in which.

DETAILED DESCRIPTION

Embodiments of the present invention are described below by way of example only. These examples represent the best ways of putting the invention into practice that are currently known to the Applicant although they are not the only ways in which this could be achieved. The description sets forth the functions of the example and the sequence of steps for constructing and operating the example. However, the same or equivalent functions and sequences may be accomplished by different examples.

Figure 1:
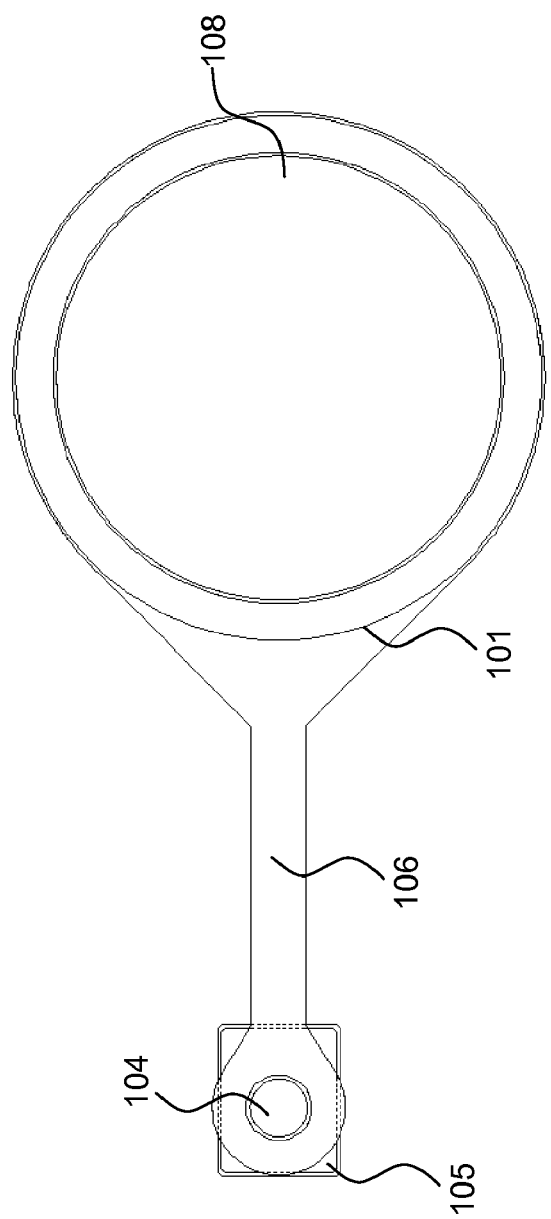
FIG. 1 shows perspective and cross section views of a prior art WLCSP device.
Figure 1:
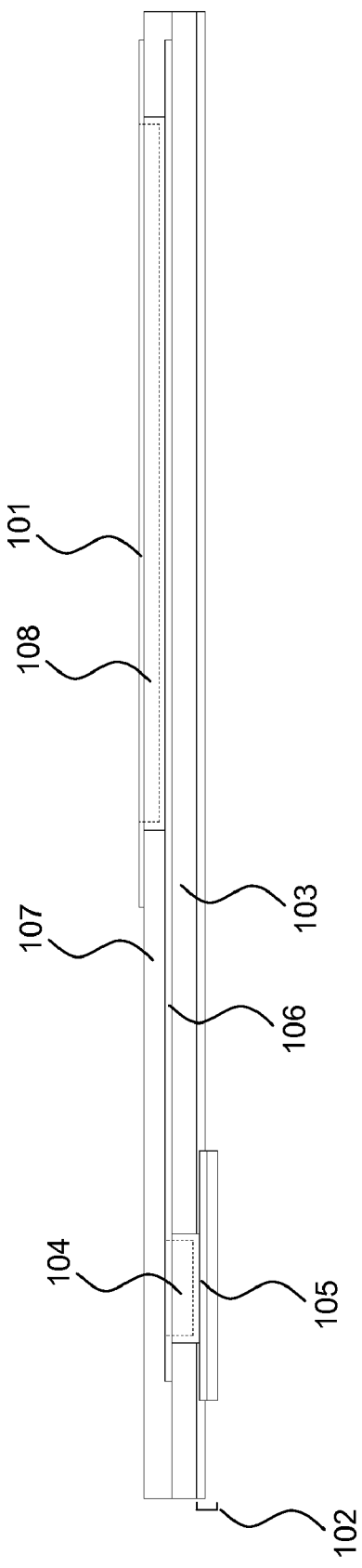
Figure 2:
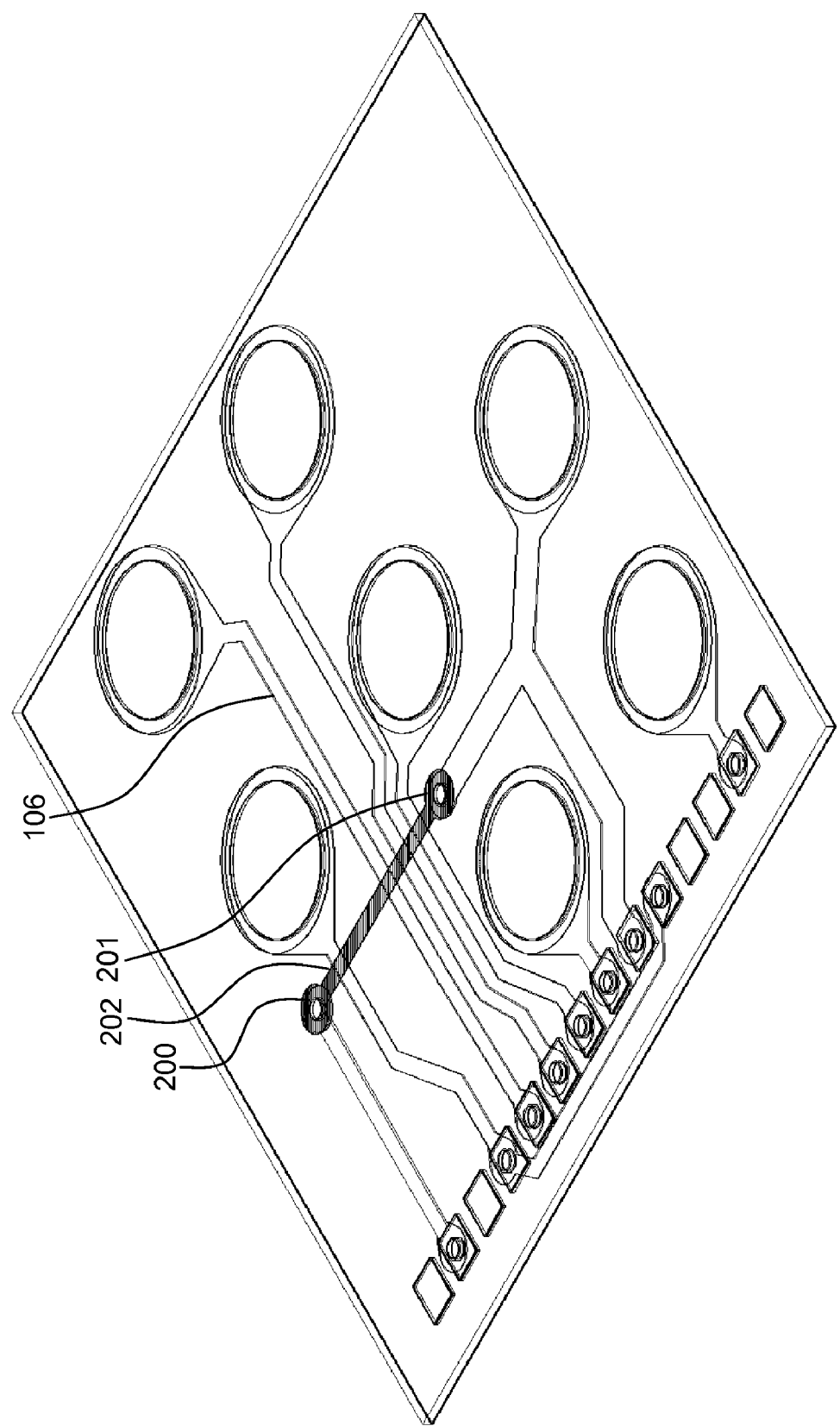
FIG. 2 shows the use of an Under Ball Metallisation layer to form links between tracks in a Redistribution Layer.

FIG. 2 shows a perspective view of an RDL and UBM layer routing system which allows tracks to cross without requiring additional layers. The density of tracks can therefore be increased without significant additional expense.

Vias 200, 201 are defined between the RDL and the UBM layers, and a track 202 is defined in the UBM layer to connect the vias 200, 201. In contrast to conventional layouts the UBM layer is utilised as a routing layer, thus allowing tracks to be crossed without requiring additional layers.

Figure 3:
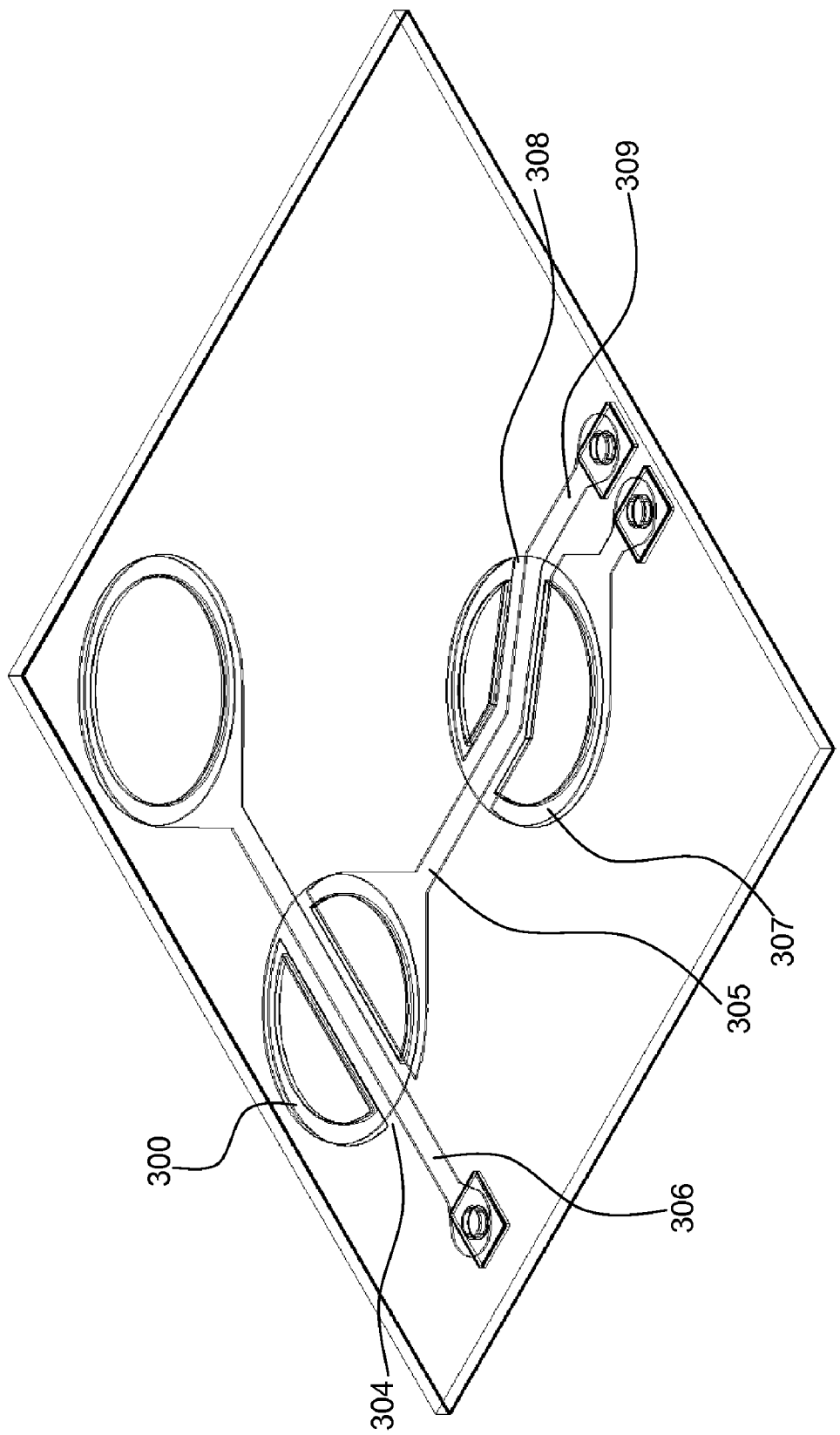
FIG. 3 shows the routing of tracks underneath lands defined in an Under Ball Metallisation Layer.
Figure 4:
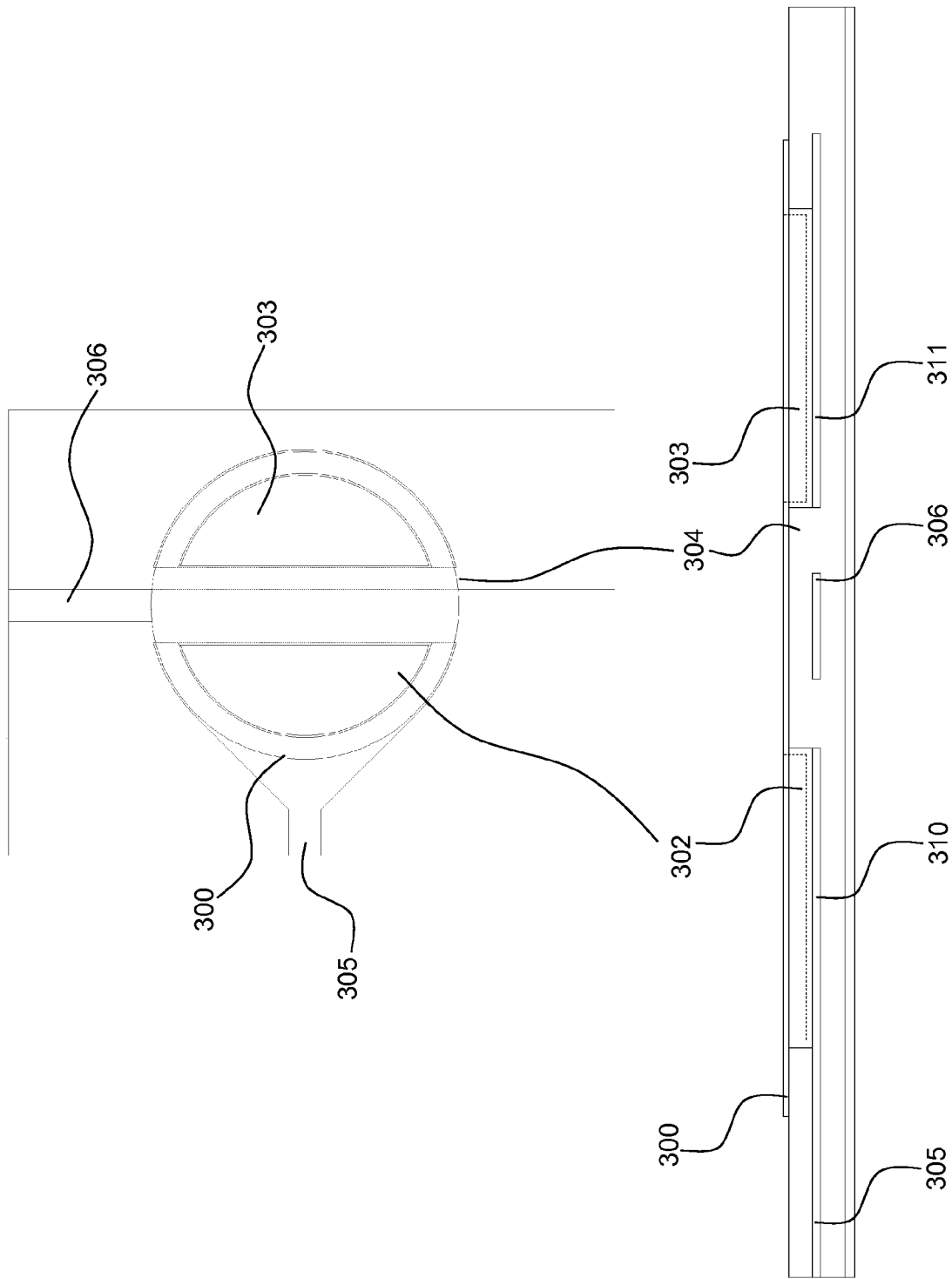
FIG. 4 shows plan and cross-section views of a land shown in FIG. 3.

FIG. 3 shows a perspective view of a WLCSP device including a further method of routing signals in the RDL from the IC to solder ball lands in the UBM layer. FIG. 4 shows plan and cross section views of the area around a solder ball land 300. In a first example of a solder ball land 300 the RDL 310, 311 and via 302, 303 have been patterned in two halves with a channel 304 between the two halves. The first half 310 of the RDL and first half 302 of the via act in the conventional way to conduct signals from the RDL track 305 to the solder ball land 300. The second half 303 of the via and second half 311 RDL provide mechanical support for the solder ball land 300 and keying of the metallic layers to the polymer and IC.

The channel 304 is utilised to route a further signal track 306 in the RDL, thereby allowing tracks to cross without requiring an additional layer.

As shown in relation to UBM land 307 in FIG. 3, the channel 308 through the via and RDL is not necessarily straight, but may take a particular shape to allow efficient routing of tracks in the RDL. The path of the channel also contributes to the mechanical properties of the UBM land, which should be considered when selecting the route under the UBM land. In prior art systems the track 309 would have to be routed alongside land 307 thereby increasing the area required for equivalent connectivity.

The routing system of FIG. 3 may have advantages over that shown in FIG. 2 as the system of FIG. 2 leaves exposed tracks in the UBM layer which may decrease reliability or increase the likelihood of solder short circuit. In contrast, the system of FIG. 3 does not increase the number of tracks in the UBM. Furthermore, the system of FIG. 2 requires an increased number of via locations to allow tracks to cross, whereas the system of FIG. 3 does not require any additional via locations as track crossings occur in existing via locations.

The channel and track under the UBM solder ball land has the potential to affect the mechanical and electrical properties of the UBM land. However, a typical UBM solder ball land has a diameter of 240 μm, compared to a typical track width of 10-25 m. The channel is therefore small in comparison to the solder ball land and therefore unlikely to have any substantial effect on the properties of the land.

Conventional design and manufacturing techniques may be utilised to design and manufacture devices utilising the routing systems described herein.

There may be electrical interaction between the UBM land, via and RDL area, and the track running though the channel in the via and RDL which can be accounted for in the design process using conventional techniques. That interaction may be utilised to provide known values of parasitic capacitance or inductance between the signal paths, for example to achieve electrical supply de-coupling, or to provide a desired interaction or coupling between differential signal paths.

The figures have shown a single redistribution layer, but multiple redistribution layers may be utilised while still applying the principles of the invention set out herein.

Where lands are described as solder ball lands, it will be understood that it is intended to refer to lands on the surface of the WLCSP in general, and not solely to lands only for solder balls; for example printed solder bumps or copper posts may be used instead of solder balls. Solder balls may be pre-formed.

The above description has been given principally in the context of WLCSP technology, but the techniques are equally applicable to packaging other integrated devices as well as semiconductor ICs. For example, the techniques may also be applied to Integrated Passive Devices (IPDs), Micro Electro Mechanical Systems (MEMS) devices, Optical Micro Electro Mechanical Systems (OMEMS) devices, display devices, and image sensor devices. In addition to wafers, the technique may be used for panels of electrical, or electronic components. Similarly materials systems such as ceramics and glasses may be utilised.

Where the terms overlying or above have been used in this document they are not intended, unless otherwise indicated, to indicate that the part or layer has the same extent or is located in the same or overlapping area when viewed in the plan view of the wafer, or panel, but rather that the part or layer lies generally above when viewed in cross section—that is closer to the surface of the device, and further from the IC. Similarly, the words under and below are used to indicate that the part or layer lies generally below when viewed in cross section—that is further from the surface, and closer to the IC.

Polymer is provided as an example of a dielectric layer for insulating the metallic layers, but as will be appreciated other materials may also be utilised. For example, ceramics or glasses may be appropriate depending on the material system being utilised.

In the above description an example of a via formed in two parts has been given. The via may also be formed in more than two parts and there may be more than one insulating channel between the multiple parts. One or more tracks may be routed through the more than one insulating channel.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to 'an' item refers to one or more of those items. The term 'comprising' is used herein to mean including the method blocks or elements identified, but that such blocks or elements do not comprise and exclusive list and a method or apparatus may contain additional blocks or elements.

The steps of the methods described herein may be carried out in any suitable order, or simultaneously where appropriate.

It will be understood that the above description of a preferred embodiment is given by way of example only and that various modifications may be made by those skilled in the art. Although various embodiments have been described above with a certain degree of particularity, or with reference to one or more individual embodiments, those skilled in the art could make numerous alterations to the disclosed embodiments without departing from the spirit or scope of this invention.

What is claimed is:

1. An electronic component comprising an integrated device and a plurality of packaging layers, the packaging layers comprising:
   a metallic layer of the packaging layers on a surface of the component comprising a land;
   a metallic redistribution layer of the packaging layers below the surface of the component comprising a first track for routing signals from the land to other locations in the component;
   an upper insulating layer of the packaging layers between the metallic layer and the metallic redistribution layer;
   a via through the upper insulating layer connecting the land to the first track in the redistribution layer; and
   a second track in the redistribution layer which is routed through a gap in the first track and via below the extent of the land, such that the second track does not make electrical contact with the land, via or first track within the extent of the land.

2. A component according to claim 1, wherein the via is formed in at least two discrete parts with an insulating channel between at least two of the parts, wherein the insulating channel forms the gap for routing the second track.

3. A component according to claim 1 comprising a plurality of lands, vias, and tracks, wherein a plurality of tracks are routed through a plurality of corresponding gaps in other tracks and vias.

4. A component according to claim 2, wherein the insulating channel is straight.

5. A component according to claim 2, wherein the insulating channel is not straight.

6. A component according to claim 1, wherein the component is a Wafer Level Chip Scale Packaged device, the land is a solder ball land, and the integrated device is an integrated circuit, the component further comprising:
   a lower insulating layer of the packaging layers for insulating the redistribution layer from the integrated circuit, and at least one via through the lower insulating layer connecting a track in the redistribution layer to a pad on the integrated circuit.

7. A method of defining signal routes in an electronic component comprising an integrated device and a plurality of packaging layers, the method comprising the steps of:
   defining a land in a surface metallic layer of the packaging layers;
   defining a via connecting the land to a first track in a redistribution layer of the packaging layers, wherein the surface metallic layer is separated from the first track in the redistribution layer by an upper insulating layer;
   defining a gap in the via and first track within the extent of the land; and
   defining a second track in the redistribution layer, wherein the second track is routed through the gap such that it does not make electrical contact with the land, via or first track within the extent of the land.

8. A method according to claim 7, wherein the via between the land and the first track is defined in at least two discrete parts with an insulating channel between at least two of the parts forming the gap for the routing of the second track.

9. A method according to claim 8, wherein the insulating channel is straight.

10. A method according to claim 8, wherein the insulating channel is not straight.

11. A method according to claim 7 wherein the electronic component is a Wafer Level Chip Scale Packaged device, the land is a solder ball land, and the integrated device is an integrated circuit, the component further comprising:
    a lower insulating layer for insulating the redistribution layer from the integrated circuit, and at least one via through the lower insulating layer connecting a track in the redistribution layer to a pad on the integrated circuit.

12. A method of manufacturing a wafer having at least one electronic component comprised of an integrated device and a plurality of packaging layers, the method comprising the steps of:
    defining a land in a surface metallic layer of the packaging layers;
    defining a via connecting the land to a first track in a redistribution layer of the packaging layers, wherein the surface metallic layer is separated from the first track in the redistribution layer by an upper insulating layer;
    defining a gap in the via and first track within the extent of the land; and
    defining a second track in the redistribution layer, wherein the second track is routed through the gap such that it does not make electrical contact with the land, via or first track within the extent of the land.

13. A wafer comprising:
    at least one component comprised of an integrated device and a plurality of packaging layers wherein the packaging layers comprise:
    a metallic layer of the packaging layers on a surface of the component comprising a land;
    a metallic redistribution layer of the packaging layers below the surface comprising a first track for routing signals from the land to other locations in the component;
    an upper insulating layer of the packaging layers between the metallic layer and the first track in the metallic redistribution layer;
    a via through the upper insulating layer connecting the land to the first track in the redistribution layer; and
    a second track in the redistribution layer which is routed through a gap in the first track and via below the extent of the land, such that the second track does not make electrical contact with the land, via or first track within the extent of the land.

* * * * *

UNITED STATES PATENT AND TRADEMARK OFFICE
CERTIFICATE OF CORRECTION

PATENT NO. : 8,368,224 B2  
APPLICATION NO. : 12/829745  
DATED : February 5, 2013  
INVENTOR(S) : Zaid Aboush Page 1 of 1

It is certified that error appears in the above-identified patent and that said Letters Patent is hereby corrected as shown below:

On the Title Page, in Item (30), under "Foreign Application Priority Data", in Column 1, Line 1, delete "091176.2" and insert -- 0911767.2 --, therefor.

Signed and Sealed this
Seventh Day of May, 2013

Teresa Stanek Rea
*Acting Director of the United States Patent and Trademark Office*